(12) United States Patent
Sewell et al.

(10) Patent No.: US 10,056,506 B2
(45) Date of Patent: Aug. 21, 2018

(54) FIRING METAL WITH SUPPORT

(71) Applicant: SUNPOWER CORPORATION, San Jose, CA (US)

(72) Inventors: Richard Hamilton Sewell, Los Altos, CA (US); Paul Loscutoff, Castro Valley, CA (US); Michel Arsène Olivier Ngamo Toko, Brussels (BE)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 0 days.

(21) Appl. No.: 15/428,040

(22) Filed: Feb. 8, 2017

(65) Prior Publication Data
US 2017/0148934 A1    May 25, 2017

Related U.S. Application Data

(62) Division of application No. 14/039,855, filed on Sep. 27, 2013, now Pat. No. 9,570,206.

(51) Int. Cl.
*H01L 31/0224* (2006.01)
*H01L 31/18* (2006.01)

(52) U.S. Cl.
CPC .. *H01L 31/022425* (2013.01); *H01L 31/1864* (2013.01)

(58) Field of Classification Search
CPC ..... H01B 1/02; H01B 1/022425; H01L 31/18; H01L 31/1864
See application file for complete search history.

(56) References Cited

U.S. PATENT DOCUMENTS

2012/0142140 A1    6/2012    Li et al.
2013/0025673 A1    1/2013    Huebel et al.

FOREIGN PATENT DOCUMENTS

JP           56-160078         12/1981

OTHER PUBLICATIONS

FAI Pre-Interview Communication from U.S. Appl. No. 14/039,855 dated May 11, 2016, 12 pgs.

*Primary Examiner* — Susan D Leong
(74) *Attorney, Agent, or Firm* — Schwabe, Williamson & Wyatt, P.C.

(57) ABSTRACT

A solar cell can include a substrate and a semiconductor region disposed in or above the substrate. The solar cell can also include a conductive contact disposed on the semiconductor region with the conductive contact including a paste, a first metal, and a first conductive portion that includes a conductive alloy formed from the first metal at an interface of the substrate and the semiconductor region.

20 Claims, 6 Drawing Sheets

FIRING METAL WITH SUPPORT

CROSS-REFERENCE TO RELATED APPLICATIONS

This application is a divisional of U.S. patent application Ser. No. 14/039,855, filed on Sep. 27, 2013, the entire contents of which are hereby incorporated by reference herein.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductive portion of a solar cell does not necessarily imply that this conductive portion is the first conductive portion in a sequence; instead the term "first" is used to differentiate this conductive portion from another conductive portion (e.g., a "second" conductive portion).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of solar cells for ease of understanding, the disclosed techniques and structures apply equally to other semiconductor structures (e.g., silicon wafers generally).

Solar cell conductive contacts and methods of forming solar cell conductive contacts are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells having conductive contacts. In one embodiment, a solar cell includes a substrate. A semiconductor region is disposed in or above the substrate. A conductive contact is disposed on the semiconductor region and can include a first conductive portion comprising an alloy of a first metal and the substrate at an interface of the substrate and the semiconductor region.

Also disclosed herein are methods of fabricating solar cells having conductive contacts. In one embodiment, a method of fabricating a solar cell involves forming a paste on a silicon substrate. The method can also include depositing a metal (e.g., nickel) on the paste and firing the nickel to form a first conductive portion that electrically couples the metal to the silicon substrate. The method can also include forming a conductive contact that includes the first conductive portion for the solar cell.

This specification first describes an example solar cell that may include the disclosed conductive contacts, followed by a more detailed explanation of various embodiments of conductive contact structures. For additional context and to facilitate a better understand of the disclosure, the specification then includes a description of various steps for fabricating a solar cell having conductive contacts. Last, the specification includes a description of an example method for forming the disclosed conductive contacts.

In a first exemplary solar cell, a seed layer is used to fabricate contacts, such as back-side contacts, for a solar cell having emitter regions formed above a substrate of the solar cell. For example, FIG. 1A illustrates a cross-sectional view of a portion of a solar cell having conductive contacts formed on emitter regions formed above a substrate, in accordance with an embodiment of the present disclosure.

Figure 1A:
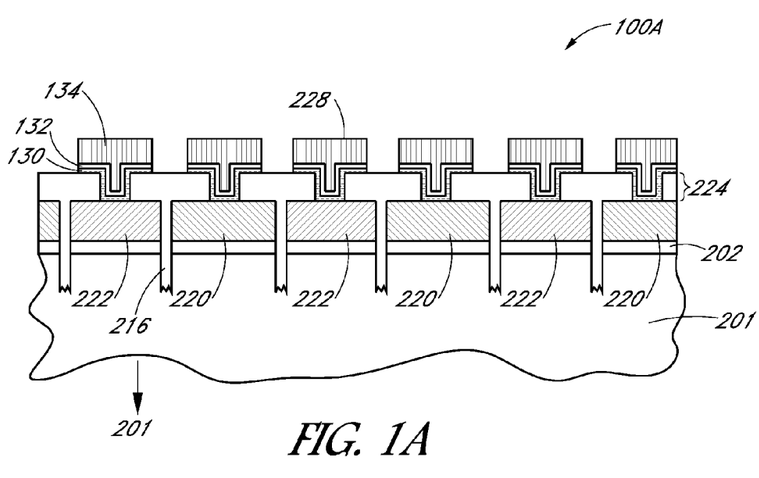
FIG. 1A illustrates a cross-sectional view of a portion of an example solar cell having conductive contacts formed on emitter regions formed above a substrate, according to one embodiment.

Referring to FIG. 1A, a portion of solar cell 100A includes patterned dielectric layer 224 disposed above a plurality of n-type doped polysilicon regions 220, a plurality of p-type doped polysilicon regions 222, and on portions of substrate 200 exposed by trenches 216. Conductive contacts 228 are disposed in a plurality of contact openings disposed in dielectric layer 224 and are coupled to the plurality of n-type doped polysilicon regions 220 and to the plurality of p-type doped polysilicon regions 222. The materials of, and methods of fabricating, the patterned dielectric layer, the plurality of n-type doped polysilicon regions 220, the plurality of p-type doped polysilicon regions 222, substrate 200, and trenches 216 may be as described below in association with FIGS. 4A-4C.

Furthermore, the plurality of n-type doped polysilicon regions 220 and the plurality of p-type doped polysilicon regions 222 can, in one embodiment, provide emitter regions for solar cell 100A. Thus, in an embodiment, conductive contacts 228 are disposed on the emitter regions. In an embodiment, conductive contacts 228 are back contacts for a back-contact solar cell and are situated on a surface of the solar cell opposing a light receiving surface (direction provided as 201 in FIG. 1A) of solar cell 100A. Furthermore, in one embodiment, the emitter regions are formed on a thin or tunnel dielectric layer 202, described in greater detail in association with FIG. 4A.

Still referring to FIG. 1A, each of conductive contacts 228 can include conductive layer 130, nickel (Ni) layer 132, and copper (Cu) layer 134. In one embodiment, conductive layer 130 can include a first conductive portion that includes an alloy (e.g., nickel silicide) at an interface of the substrate and the semiconductor region. The nickel silicide can be formed as a result of firing Ni layer 132. Examples of firing include heating in a furnace or by laser annealing, among other examples. Conductive layer 130 can also include a paste (also referred to as a seed layer) in contact with the emitter regions of the solar cell 100A. In some embodiments, the paste may be a fired conductive paste layer with the fired conductive paste layer being a second conductive portion of the conductive contact. In other embodiments, the paste may be non-conductive. The first and second conductive portions are illustrated in more detail in FIGS. 2A-2D and 3A-3D.

Figure 2A:
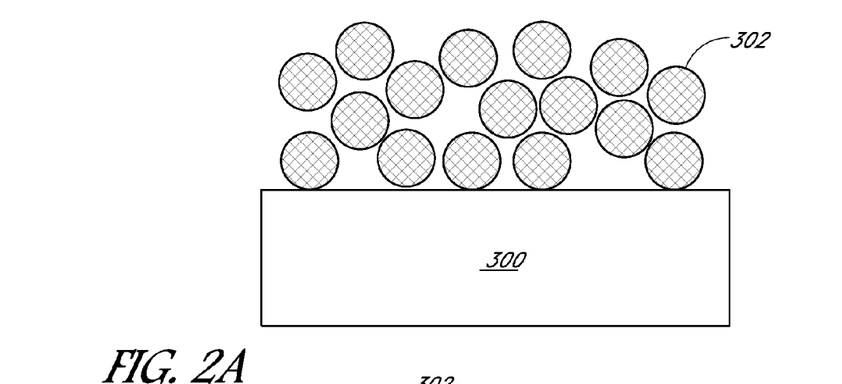
FIGS. 2A-2D illustrate cross-sectional views of a portion of an example conductive contact, according to one embodiment.

Turning now to FIGS. 2A-2D, a more detailed view of an example conductive contact is shown. As shown in FIG. 2A, paste 302 is deposited on substrate 300. As noted above, paste 302 may be a conductive or non-conductive paste. Examples of conductive paste include aluminum, aluminum-silicon alloy, tin, conductive carbon, etc. As described herein, a non-conductive paste may provide structural support onto which a metal layer may be deposited. In various embodiments, the printed paste can have a thickness of approximately 1-10 microns (may not be printed in an equal or uniform distribution). Although metal paste 302 is depicted as spherical particles for ease of illustration, the particles may not necessarily be the same size or the same shape.

In one embodiment, depositing the paste may include printing (e.g., screen printing, ink-jet printing, etc.) paste 302 on substrate 300. The paste may include a solvent for ease of delivery of the paste and may also include other elements, such as binders or frit.

To provide context, printed paste may be used as a low cost seed for subsequent metal plating operations for solar cell metallization. For example, the paste can be printed in a pattern (e.g., a pre-determined pattern consistent with the fingers or contact regions for the solar cell) such that the paste does not have to subsequently be masked and etched to form the pattern. Accordingly, printed seed paste may provide a higher throughput lower cost technique than sputtered seed.

Printed conductive paste (e.g., metal paste, conductive carbon paste, etc.) can include conductive particles, which upon being fired, create electrical contact to the silicon surface and create electrical contact among the conductive particles. Melting the conductive particles can create a dense film with contact to the substrate but the melting can also damage the actual wafer. If the conductive particles do not melt, it can be difficult to create a low contact resistance connection to the substrate and a low sheet resistance within the conductive particle film. These resistances can contribute to the solar cell series resistance and therefore limit the performance of the cell. As described herein, the disclosed structures and techniques can improve the electrical properties of the conductive contact of a solar cell.

Figure 2B:
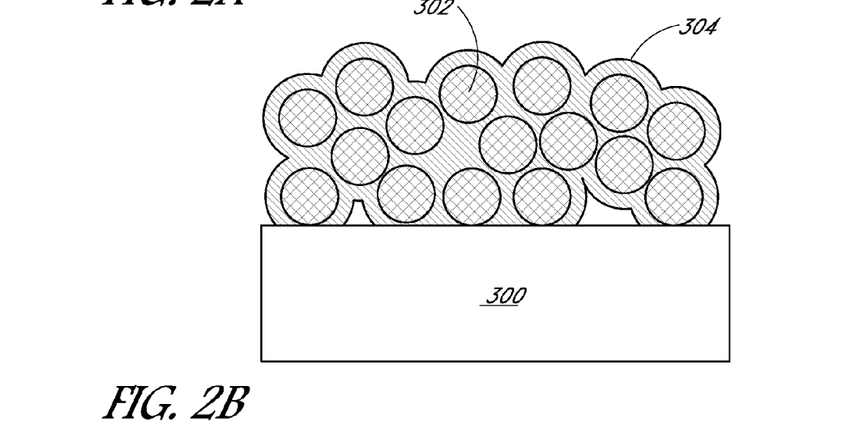

As shown in the example of FIG. 2B, nickel 304 is deposited on paste 302. In one embodiment, nickel may be plated according to an electroless nickel plating technique. In other embodiments, other nickel deposition techniques may be used to deposit the nickel.

Figure 2C:
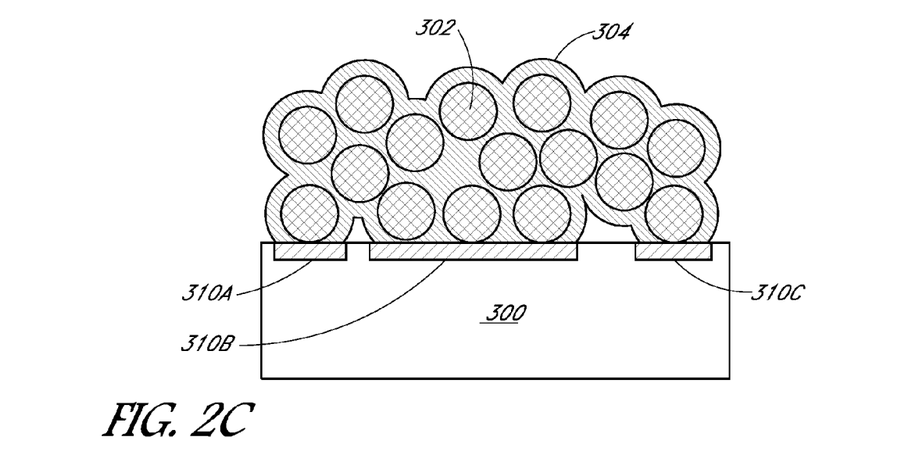

FIG. 2C illustrates three first conductive portions 310a-310c that result from firing nickel layer 304. First conductive portions 310a-310c can operate as a low contact resistance connection to the substrate. In an embodiment in which the nickel is plated above a silicon substrate and fired, first conductive portions 310a-310c include nickel silicide. Note that in an embodiment in which the nickel is plated on a conductive paste, firing the nickel may also result in alloying of the conductive paste such that the first conductive portions include an alloy of the conductive paste, nickel, and silicon substrate. Also note that, as depicted in FIG. 2C, the nickel silicide may not be a continuous layer across the whole contact. The discontinuous conductive portions, though, may nevertheless be electrically coupled to one another such that a single conductive contact that includes the conductive portions can be formed.

Figure 2D:
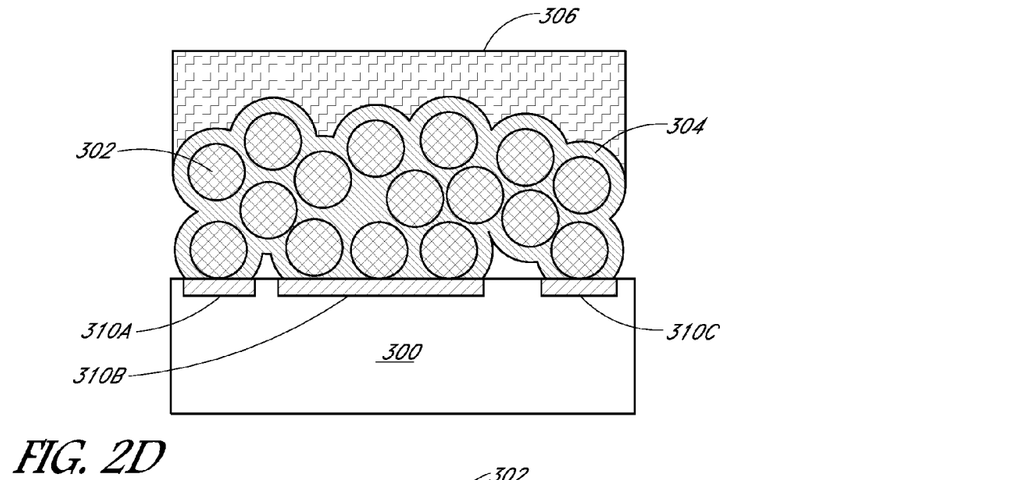

FIG. 2D shows copper 306 deposited (e.g., plated) on nickel 304. The first conductive portions may be referred to as the conductive layer, as in conductive layer 130, and collectively, the first conductive portions, nickel, and copper may be referred to as a conductive contact of the solar cell.

In embodiments in which the paste is a conductive paste, firing the nickel can improve particle film conductivity by alloying the nickel with the conductive particles to form alloys with low interface resistance between the particles and intercalated nickel films, resulting in a lowering of the sheet resistance for the particle/nickel film. In embodiments in which a non-conductive paste is used, a cheaper paste that provides structural support for the plated nickel (or other metal) can be used and a low firing temperature can also be used, thereby lowering risk of damage to the substrate.

Figure 3A:
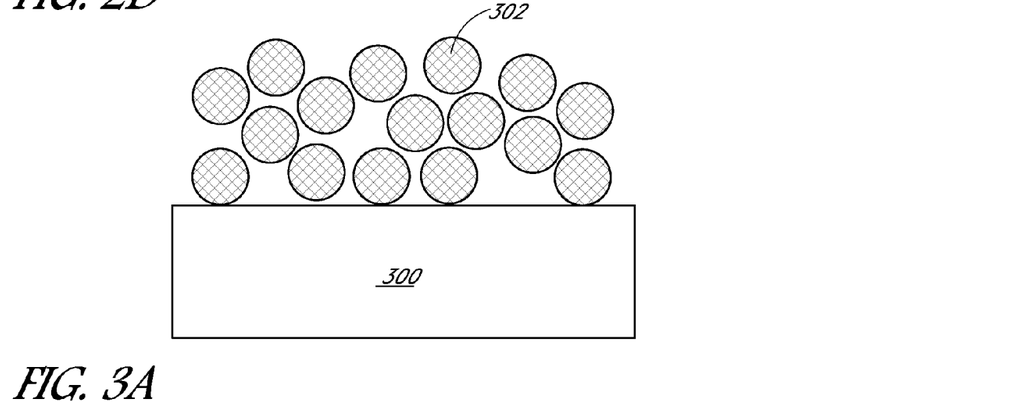
FIGS. 3A-3E illustrate cross-sectional views of a portion of another example conductive contact, according to one embodiment.
Figure 3B:
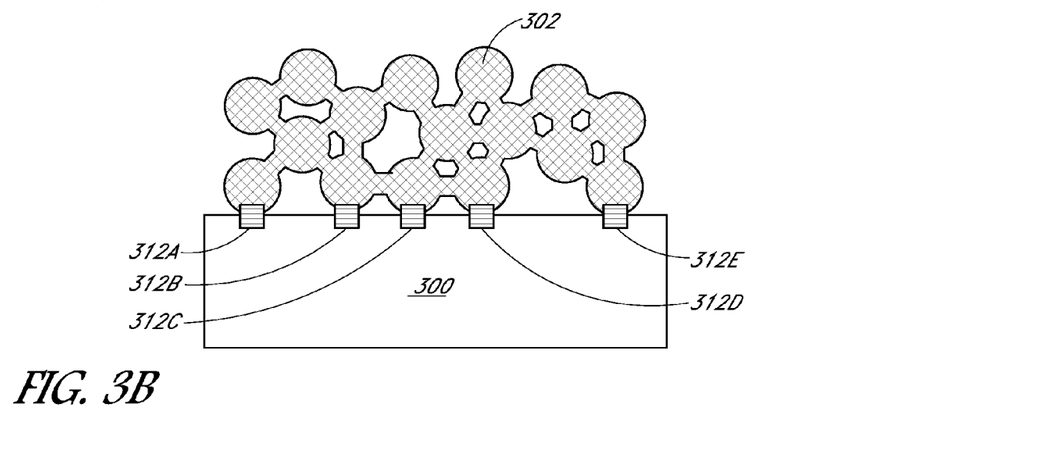

FIGS. 3A-3D illustrate another example detailed view of a conductive contact, according to one embodiment. As was the case in FIG. 2A, FIG. 3A illustrates paste 302, which is a conductive paste in the example of FIGS. 3A-3D, deposited on substrate 300. Different from FIG. 2B, FIG. 3B illustrates other conductive portions, second conductive portions 312a-312e, which result from firing conductive paste 302. In addition to the second conductive portions, FIG. 3B also illustrates various particles of the conductive paste at least partially melting together, which can provide greater continuity among the various conductive particles and from the conductive particles to the substrate.

Figure 3C:
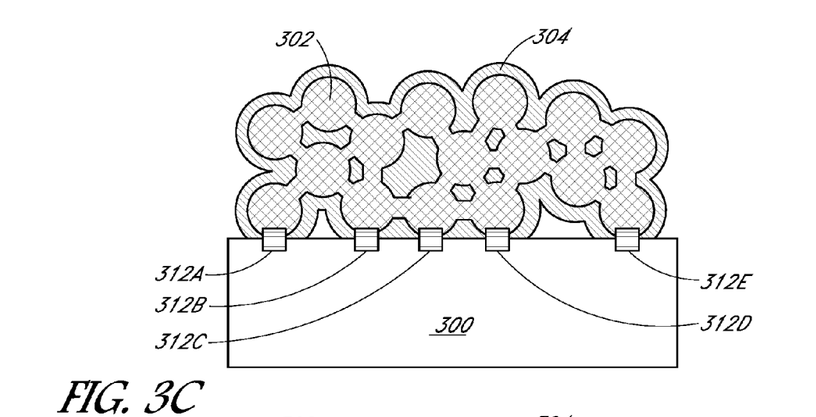
Figure 3D:
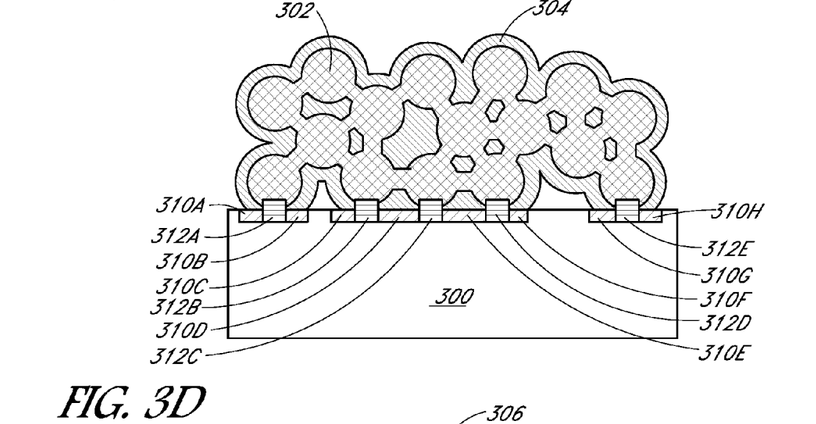
Figure 3E:
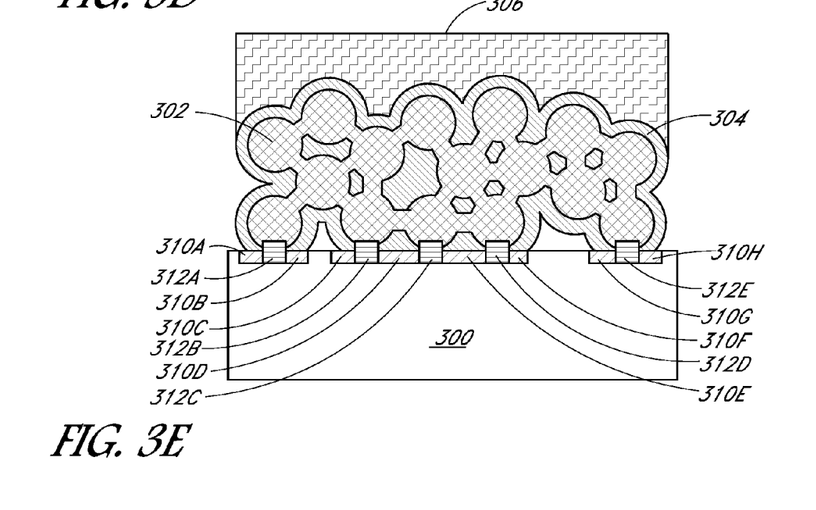

After firing conductive paste 302, FIG. 3C illustrates nickel 304 deposited on the fired metal paste. Similar to FIG. 2C, FIG. 3D illustrates first conductive portions 310a-h that result from firing nickel 304. Thus, the embodiment of a solar cell having conductive contacts shown in FIG. 3D includes both first conductive portions 310 and second conductive portions 312. Note that firing of the nickel may also result in alloying the conductive paste to the silicon substrate. As was the case with FIG. 2D, FIG. 3E illustrates copper 306 deposited (e.g., plated) on nickel 304.

Accordingly, in various embodiments (e.g., as shown in FIGS. 3A-3E), the conductive paste can be fired and the resulting fired paste can form the second conductive portions of conductive layer 130. In other embodiments (e.g., as shown in FIGS. 2A-2D), the paste may not be separately fired (not including the firing of the nickel deposited on the paste) and may not have significant electrical connection from the paste to the substrate or between particles within the paste prior to nickel deposition, instead serving as a support for the plated nickel. As described herein, the nickel can be fired to form the first conductive portions of conductive layer 130 regardless of whether the metal paste is also fired before the nickel is deposited. Also as described herein, because the nickel is plated to the paste, firing of the nickel may also result in firing of the paste even though the paste may not be fired separately before plating the nickel. For conductive pastes, the conductive paste may alloy with the silicon substrate and/or the nickel as a result of the nickel firing. The amount of alloying can vary according to the composition of the paste, the metal (e.g., nickel) plated to the paste, the substrate composition (e.g., silicon), and the firing technique (e.g., temperature), among other variables.

Figure 1B:
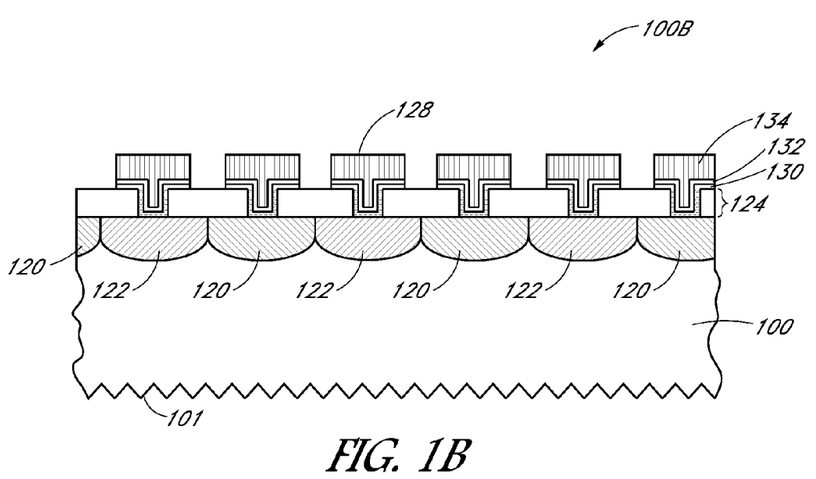
FIG. 1B illustrates a cross-sectional view of a portion of an example solar cell having conductive contacts formed on emitter regions formed in a substrate, according to one embodiment.

Turning now to FIG. 1B, a cross-sectional view of a portion of an example solar cell having conductive contacts formed on emitter regions formed in a substrate is illustrated, according to one embodiment. For example, in this second exemplary cell, a seed layer is used to fabricate contacts, such as back-side contacts, for a solar cell having emitter regions formed in a substrate of the solar cell.

As shown in FIG. 1B, a portion of solar cell 100B includes patterned dielectric layer 124 disposed above a plurality of n-type doped diffusion regions 120, a plurality of p-type doped diffusion regions 122, and on portions of substrate 100, such as a bulk crystalline silicon substrate. Conductive contacts 128 are disposed in a plurality of contact openings disposed in dielectric layer 124 and are coupled to the plurality of n-type doped diffusion regions 120 and to the plurality of p-type doped diffusion regions 122. In an embodiment, diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for solar cell 100B. Thus, in an embodiment, conductive contacts 128 are disposed on the emitter regions. In an embodiment, conductive contacts 128 are back contacts for a back-contact solar cell and are situated on a surface of the solar cell opposing a light receiving surface, such as opposing a texturized light receiving surface 101, as depicted in FIG. 1B.

In one embodiment, referring again to FIG. 1B, conductive contacts 128 can include conductive layer 130, nickel (Ni) layer 132, and copper (Cu) layer 134. In one embodiment, as was the case in the example solar cell of FIG. 1A and as shown in FIGS. 2A-2D and 3A-3E, conductive layer 130 can include one or more first conductive portions that include an alloy (e.g., nickel silicide) at an interface of the substrate and the semiconductor region. The alloy can be formed as a result of firing Ni layer 132. Conductive layer 130 can also include a paste in contact with the emitter regions of the solar cell 100A. In some embodiments, the paste may be a fired metal paste (e.g., fired before firing the nickel) with the fired paste resulting in second conductive portions of the conductive contact. In other embodiments, the paste may serve as structural support for the deposited nickel and not provide additional electrical connectivity for the conductive contact.

Although certain materials are described specifically above with reference to FIGS. 1A, 1B, 2A-2D, and 3A-3E, some materials may be readily substituted with others with other such embodiments remaining within the spirit and scope of embodiments of the present disclosure. For example, in an embodiment, a different material substrate, such as a group III-V material substrate, can be used instead of a silicon substrate. In such an embodiment, instead of nickel silicide being formed from firing the nickel layer, another conductive layer can be formed from fired nickel and the different material substrate. As another example, in one embodiment, silver (Ag) particles, carbon (C), tin, or the like can be used in a seed paste in addition to or instead of Al particles. In another embodiment, plated or like-deposited cobalt (Co) or tungsten (W) can be used instead of or in addition to the Ni layer described above. As is the case with the Ni layer, the Co or W may be fired resulting in the first conductive portions.

Note that, in various embodiments, the formed contacts need not be formed directly on a bulk substrate, as was described in FIG. 1B. For example, in one embodiment, conductive contacts such as those described above are formed on semiconducting regions formed above (e.g., on a back side of) as bulk substrate, as was described for FIG. 1A. As an example and to provide additional context to the fabrication of a solar cell, FIGS. 4A-4C illustrate cross-sectional views of various processing operations in one example embodiment of fabricating solar cells having conductive contacts.

Figure 4A:
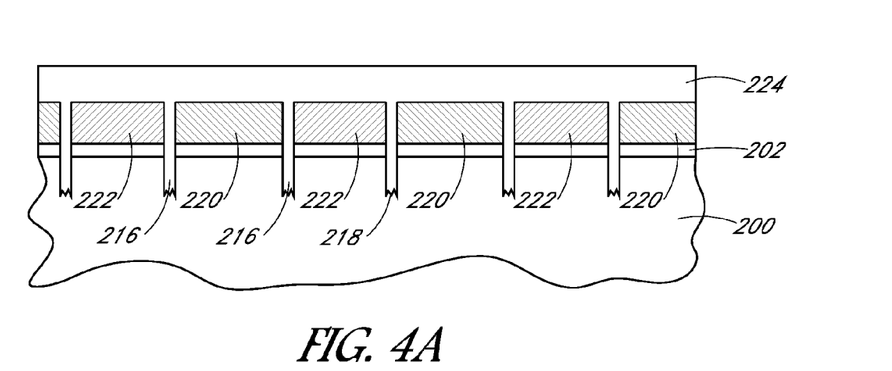
FIGS. 4A-4C illustrate cross-sectional views of fabricating solar cells having conductive contacts, according to one embodiment.

Referring to FIG. 4A, fabricating a back-contact solar cell can include forming thin dielectric layer 202 on substrate 200. In one embodiment, thin dielectric layer 202 is composed of silicon dioxide and has a thickness approximately in the range of 5-50 Angstroms. In one embodiment, thin dielectric layer 202 performs as a tunnel oxide layer. In an embodiment, substrate 200 is a bulk monocrystalline silicon substrate, such as an n-type doped monocrystalline silicon substrate. However, in an alternative embodiment, substrate 200 includes a polycrystalline silicon layer disposed on a global solar cell substrate.

Referring again to FIG. 4A, trenches 216 can be formed between n-type doped polysilicon regions 220 and p-type doped polysilicon regions 222. Portions of trenches 216 can be texturized to have textured features 218, as is also depicted in FIG. 4A. Dielectric layer 224 can be formed above the plurality of n-type doped polysilicon regions 220, the plurality of p-type doped polysilicon regions 222, and the portions of substrate 200 exposed by trenches 216. In one embodiment, a lower surface of dielectric layer 224 can be formed conformal with the plurality of n-type doped polysilicon regions 220, the plurality of p-type doped polysilicon regions 222, and the exposed portions of substrate 200, while an upper surface of dielectric layer 224 is substantially flat, as depicted in FIG. 4A. In a specific embodiment, the dielectric layer 224 is an anti-reflective coating (ARC) layer.

Figure 4B:
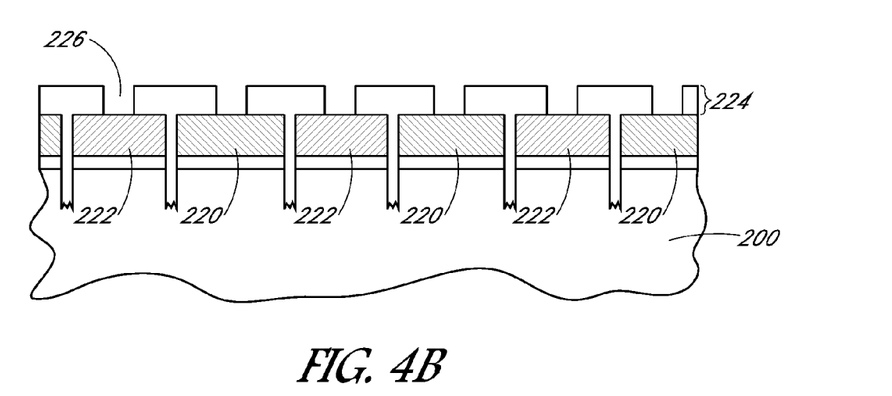
Figure 4C:
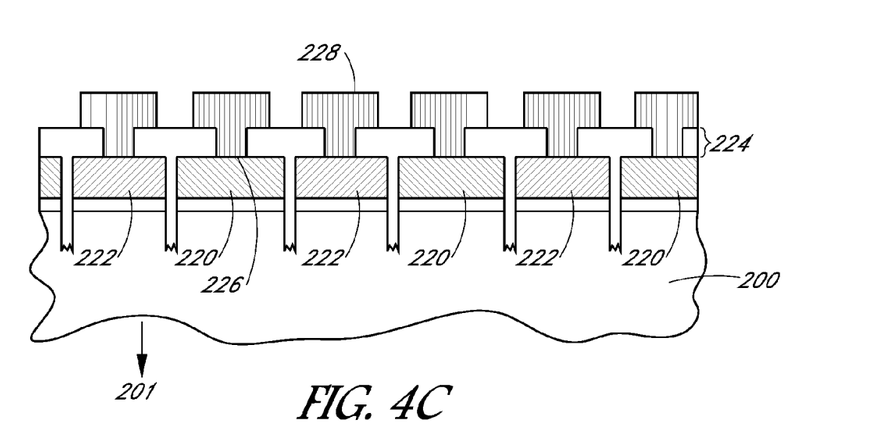

Referring to FIG. 4B, a plurality of contact openings 226 is formed in dielectric layer 224. The plurality of contact openings 226 provides exposure to the plurality of n-type doped polysilicon regions 220 and to the plurality of p-type doped polysilicon regions 222. In one embodiment, the plurality of contact openings 226 is formed by laser ablation. In one embodiment, the contact openings 226 to the n-type doped polysilicon regions 220 have substantially the same height as the contact openings to the p-type doped polysilicon regions 222, as depicted in FIG. 4B.

Referring to FIG. 4C, the method of forming contacts for the back-contact solar cell further includes forming conductive contacts 228 in the plurality of contact openings 226 and coupled to the plurality of n-type doped polysilicon regions 220 and to the plurality of p-type doped polysilicon regions 222. Thus, in an embodiment, conductive contacts 228 are formed on or above a surface of a bulk N-type silicon substrate 200 opposing a light receiving surface 201 of the bulk N-type silicon substrate 200. In a specific embodiment, the conductive contacts are formed on regions (222/220) above the surface of the substrate 200, as depicted in FIG. 4C. The conductive contacts can be the conductive contacts described herein at FIGS. 1A, 1B, 2A-2D, 3A-3E and 5.

Figure 5:
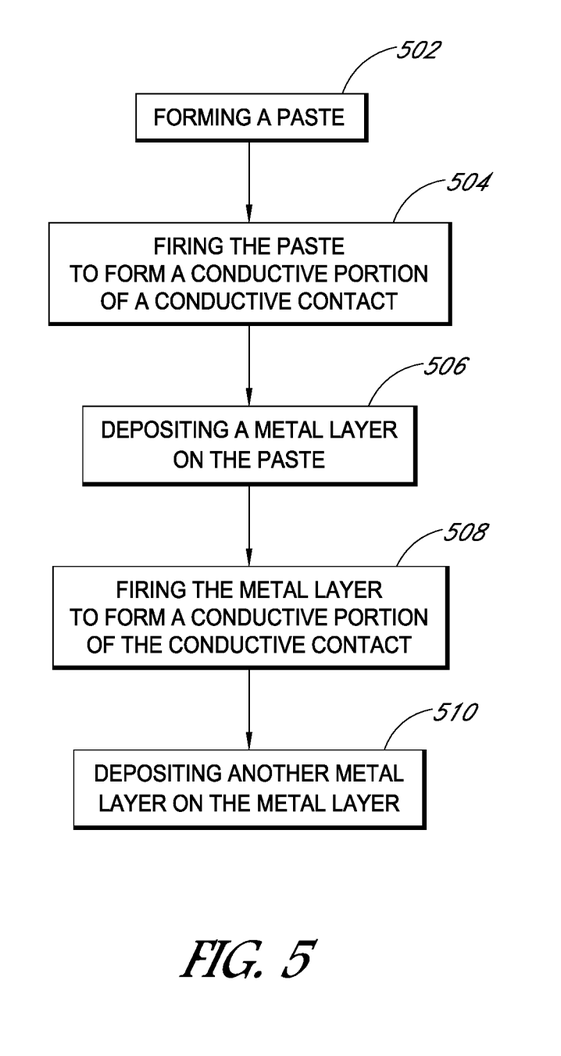
FIG. 5 is a flowchart illustrating an example method of forming a conductive contact, according to one embodiment.

Turning now to FIG. 5, a flow chart illustrating a method for forming a conductive contact is shown, according to some embodiments. In various embodiments, the method of FIG. 5 may include additional (or fewer) blocks than illustrated. For example, in some embodiments, firing the paste before the nickel is deposited as shown at 504 may not be performed.

As shown at 502, a paste can be formed. Forming the paste can include printing the paste in a pattern that is suitable for connectivity with respective p and n regions of a solar cell (e.g., in a pre-determined finger pattern). In one embodiment, the paste is formed from a mixture that includes conductive particles (e.g., metal particles), a liquid binder, and an inert filler material. In other embodiments as described herein, the composition of the paste may be different (e.g., non-conductive particles).

At 504, in one embodiment, the paste can be fired (e.g., heated, laser annealed, etc.) to form a conductive portion of the conductive contact that electrically couples the paste to the silicon substrate. For example, firing can be performed by heating according to a temperature based on the composition of the paste. For instance, for a metal paste that includes Al/Si particles, the firing temperature may be approximately 550 degrees Celsius. As described herein, the result of firing the paste can be the formation of a conductive portion of the conductive contact. Note that the conductive portion can be irregular and not a uniform layer, as illustrated by the five square regions in FIGS. 3B-3E.

As illustrated at 506, a metal layer, such as a nickel layer, can be deposited on the paste. For example, in one embodiment, nickel can be deposited on the metal paste layer according to an electroless nickel plating technique.

As shown at 508, the nickel may be fired (e.g., heated, laser annealed, etc.) to form a conductive portion of the conductive contact that electrically couples the nickel to the substrate. Silicides can be formed from nickel with low specific contact resistance values over a broad range of temperatures, from as low as about 300 degrees Celsius. An example illustration of such a conductive portion can be seen in FIGS. 2C and 2D. In embodiments in which the metal paste layer and the nickel layer are fired at blocks 504 and 508, respective conductive portions may be formed as a result of each firing. As described herein, such conductive portions are shown in FIGS. 3D and 3E. Note that firing the nickel 508 can also fire the paste on which the nickel is plated effectively double firing the paste if the paste was fired at block 504. The firing temperature, however, may not be high enough to significantly alloy the paste (if a conductive paste) to the nickel or silicon substrate.

At 510, another metal layer can be plated to the metal layer. For example, in one embodiment, copper can be plated to nickel that was plated to the paste at 506.

The disclosed structures and techniques can improve the electrical properties of conductive contacts. For example, by firing a wafer after depositing nickel according to the disclosed structures and techniques, contact resistance can be decreased by the silicidation reaction between nickel and silicon at the nickel/silicon interface. Additionally, the combined paste/nickel sheet resistance can also be decreased by alloying the nickel and metal particles thereby creating a less porous, continuous metal film. Further, in forming the nickel silicide, nickel is the diffusing species so pitting or spiking of the silicon substrate can be eliminated, minimized, or reduced. Additionally, nickel can also function as a barrier layer to copper diffusion.

Moreover, in embodiments in which the paste is not first fired, concerns over achieving adequate contact resistance and sheet resistance values from a paste without damaging the substrate can be removed because sufficient contact and sheet resistance can be achieved through firing the nickel at a lower temperature than the paste would be fired. Thus, a cheaper and/or non-conductive paste can be used as a support instead of relying on the paste for conductivity in the contact.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
    a substrate;
    a semiconductor region disposed in or above the substrate; and
    a conductive contact disposed on the semiconductor region, wherein the conductive contact includes a printed paste, a first metal, and a first conductive portion comprising a conductive alloy formed from the first metal and the semiconductor region, wherein the conductive alloy has a plurality of discontinuous conductive portions that electrically couples the metal to the semiconductor region at an interface of the conductive contact and the semiconductor region, and wherein the conductive alloy functions as a barrier layer to reduce pitting or spiking of the substrate.

2. The solar cell of claim 1, wherein the first metal is nickel deposited on the paste, and wherein the conductive alloy includes nickel silicide.

3. The solar cell of claim 2, wherein the conductive contact further includes a second conductive portion comprising another conductive alloy that is formed from the printed paste.

4. The solar cell of claim 2, wherein the printed paste is a conductive printed paste.

5. The solar cell of claim 2, wherein the printed paste includes aluminum particles.

6. The solar cell of claim 1, wherein the conductive contact further includes copper deposited on the first metal.

7. A solar cell, comprising:
    a substrate;
    a semiconductor region disposed in the substrate; and
    a conductive contact disposed on the semiconductor region, wherein the conductive contact includes a paste, a metal, and a conductive portion, the conductive portion comprising a conductive alloy of the metal and the semiconductor region at an interface of the conductive contact and the semiconductor region, the conductive alloy having a plurality of discontinuous conductive portions that electrically couples the metal to the semiconductor region at the interface.

8. The solar cell of claim 7, wherein the semiconductor region is a silicon region.

9. The solar cell of claim 7, wherein the metal is nickel, and wherein the conductive alloy includes nickel silicide.

10. The solar cell of claim 9, wherein the conductive contact further includes a second conductive portion comprising another conductive alloy that is formed from the paste.

11. The solar cell of claim 9, wherein the paste is a conductive printed paste.

12. The solar cell of claim 9, wherein the paste includes aluminum particles.

13. The solar cell of claim 7, wherein the conductive contact further includes copper deposited on the metal.

14. A solar cell, comprising:
    a substrate;
    a semiconductor region disposed on a dielectric layer disposed on the substrate; and
    a conductive contact disposed on the semiconductor region, wherein the conductive contact includes a paste, a metal, and a conductive portion, the conductive portion comprising a conductive alloy of the metal and the semiconductor region at an interface of the conductive contact and the semiconductor region, the conductive alloy having a plurality of discontinuous conductive portions that electrically couples the metal to the semiconductor region at the interface.

15. The solar cell of claim 14, wherein the semiconductor region is a silicon region.

16. The solar cell of claim 14, wherein the metal is nickel, and wherein the conductive alloy includes nickel silicide.

17. The solar cell of claim 16, wherein the conductive contact further includes a second conductive portion comprising another conductive alloy that is formed from the paste.

18. The solar cell of claim 16, wherein the paste is a conductive printed paste.

19. The solar cell of claim 16, wherein the paste includes aluminum particles.

20. The solar cell of claim 14, wherein the conductive contact further includes copper deposited on the metal.

* * * * *